United States Patent
Singh et al.

(10) Patent No.: US 12,301,109 B2
(45) Date of Patent: May 13, 2025

(54) METHOD FOR PERFORMING A CHARGE-SHARING OPERATION AND A CHARGE PUMP CIRCUIT THEREFOR

(71) Applicant: Samsung Electronics Co., Ltd., Suwon-si (KR)

(72) Inventors: Ravindra Kumar Singh, Bengaluru (IN); Mihir Dhagat, Bengaluru (IN); Subodh Prakash Taigor, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 18/317,458

(22) Filed: May 15, 2023

(65) Prior Publication Data

US 2024/0322677 A1 Sep. 26, 2024

(30) Foreign Application Priority Data

Mar. 22, 2023 (IN) .............................. 202341020104

(51) Int. Cl.
 *H02M 3/07* (2006.01)
 *H02M 1/38* (2007.01)

(52) U.S. Cl.
 CPC ............. *H02M 3/07* (2013.01); *H02M 1/385* (2021.05)

(58) Field of Classification Search
 CPC ....................................................... H02M 3/07
 USPC ....................................................... 327/536
 See application file for complete search history.

(56) References Cited

U.S. PATENT DOCUMENTS

| 6,967,523 B2 | 11/2005 | DeMone |
| 8,334,708 B1 | 12/2012 | Cha et al. |
| 2002/0014908 A1 | 2/2002 | Lauterbach |

(Continued)

FOREIGN PATENT DOCUMENTS

| CN | 1906832 A | 1/2007 |
| CN | 107911019 A | 4/2018 |
| CN | 207200573 U | 4/2018 |

(Continued)

OTHER PUBLICATIONS

Jiang et al, "A Multiphase Switched-Capacitor Converter for Fully Integrated AMLED Microdisplay System", Jun. 2020, IEEE Transactions of Power Electronics, vol. 35 No. 6, 6001-6011. (Year: 2020).*

(Continued)

*Primary Examiner* — Tomi Skibinski
(74) *Attorney, Agent, or Firm* — Harness, Dickey & Pierce, P.L.C.

(57) ABSTRACT

The present disclosure relates to a charge pump circuit with a six-phase clock. The charge pump circuit comprises a six-phase clock circuit and a gate boosting charge pump configured to receive a plurality of clock signals from the six-phase clock circuit. The six-phase clock circuit includes provides a first clock signal, a second clock signal, a third clock signal, a fourth clock signal, a fifth clock signal, and a sixth clock signal. The gate boosting charge pump is configured to enable a charge-sharing operation to share the stored amount of charges between a plurality of parasitic capacitors. The six-phase clock circuit is configured to provide a dead time between each of the first, second, third, fourth, fifth and sixth clock.

14 Claims, 5 Drawing Sheets

(56) References Cited

U.S. PATENT DOCUMENTS

2016/0006348 A1   1/2016   Ho et al.

FOREIGN PATENT DOCUMENTS

| CN | 207442695 U | 6/2018 |
| CN | 109327134 A | 2/2019 |
| CN | 114710026 A | 7/2022 |

OTHER PUBLICATIONS

Extended European Search Report dated Apr. 24, 2024 issued in corresponding European Appln. No. 23186014.9.
Jiang, Junmin et al. "A Multiphase Switched-Capacitor Converter for Fully Integrated AMLED Microdisplay System." IEEE Transactions on Power Electronics, vol. 35, No. 6 (2020): 6001-6011.
Patel, Kimish et al. "In-Order Pulsed Charge Recycling in Off-Chip Data Buses." VLSI, ACM (2008): 371-374.
Zhang, Jian-Wei et al. "Self-Timed Charge Recycling Search-Line Drivers in Content-Addressable Memories." Circuits and Systems 2009. ISCAS 2009. IEEE International Symposium on, IEEE (2009): 3070-3073.

* cited by examiner

METHOD FOR PERFORMING A CHARGE-SHARING OPERATION AND A CHARGE PUMP CIRCUIT THEREFOR

CROSS-REFERENCE TO RELATED APPLICATION

This application claims priority under 35 USC § 119 to Indian patent application Ser. No. 202341020104 filed on Mar. 22, 2023 in the Intellectual Property India, the contents of which are herein incorporated by reference in their entirety.

FIELD

The present disclosure relates to a high-voltage charge pump. In particular, the present disclosure relates to a method for performing a charge-sharing operation and a charge pump circuit therefore.

BACKGROUND

Charge pump circuits are known in the art. These circuits are a type of DC-DC converter which use capacitors as energy storage and transfer devices and are able to provide a power source at one or more higher or lower voltages than that obtained from one or more of the available input voltage sources. Charge pump circuits are capable of higher efficiencies. However, higher output voltage may suffer from poor power and/or area efficiency due to charge loss in parasitic capacitors associated with pump capacitors. The charge pump circuits of the prior art are usually controlled by different clock signals. However, since the clock signals are not perfect square waves, switches of the charge pump circuits may be turned on or turned off unpredictably during transitions of voltage levels of the clock signals. This may result in unwanted reverse currents, which may further increase power consumption.

Prior art such as the charge recycle mechanism (CRM) try to address the above-discussed problem up to a certain extent but fail to provide any improvement in example embodiments of "high output voltage, low output current" charge pumps due to reversion losses. For example, as shown in FIG. 1, the charge pump circuit comprises of two tristate driver, e.g., tristate driver 1 and 2. Each tristate driver comprises of one NMOS transistor and one PMOS transistor. Each PMOS transistor is provided with an input clock 'n1' and each NMOS transistor is provided with an input clock 'n2'. The main source of power loss in any charge pump architectures comes from the charging and discharging of the parasitic capacitors (Cpar1, Cpar2) in each clock period. A pass transistor (T12) has been added between two clock lines enabling charge-sharing between parasitic capacitors. This technique improves the current efficiency of the charge pump but increases the area marginally as well.

Further, as the gain of the circuit increases, the reversion loss during the charge-sharing scheme becomes the dominant source of power dissipation. During a charge-sharing operation, all the switches become ON, leading to pumping loss, output loss as well as short circuit loss. Reversion loss drops the output voltage as well. Hence, a higher value of the pump capacitor may be needed leading to an increase in the area. Hence, reversion loss reduces the current efficiency of the charge pump.

SUMMARY

This summary is provided to introduce a selection of concepts in a simplified format that are further described in the detailed description of the inventive concepts. This summary is not intended to identify key or essential inventive concepts, nor is it intended for determining the scope of the inventive concepts.

In example embodiments, the present disclosure relates to a charge pump improves power efficiency of "High output voltage, low output current" without increasing the area.

In example embodiments, the present disclosure relates to a charge pump circuit with a six-phase clock. The charge pump circuit comprises a six-phase clock circuit and a gate boosting charge pump configured to receive a plurality of clock signals from the six-phase clock circuit. The six-phase clock circuit includes: a first Boolean logic circuit including a first delay circuit configured to output a first clock signal (CLKNM1) and a second delay circuit configured to output a second clock signal (CLKPM2), a second Boolean logic circuit including a third delay circuit configured to output a third clock signal (CLKNM2) and a fourth delay circuit configured to output a fourth clock signal (CLKPM1), and a tri-state buffer circuit configured to output a fifth clock signal (CLK) and a sixth clock signal (CLK_B). The gate boosting charge pump includes a plurality of NMOS transistors configured to receive the first and third clock signals, wherein a first NMOS transistor (Mn1) of the plurality of NMOS is configured to receive the first clock signal. The pump charge circuit further comprises a plurality of PMOS transistors configured to receive the second and fourth clock signals, wherein a first PMOS transistor (Mp1) of the plurality of PMOS is configured to receive the fourth clock signal (CLKPM1). The pump charge circuit also comprises a plurality of pump capacitors (cp1, cp2), wherein each of the pump capacitors is configured to store an amount of charge. The gate boosting charge pump is further configured to enable a charge-sharing operation to share the stored amount of charges between a plurality of parasitic capacitors. The first and second Boolean logic circuit are configured to provide a dead time between each of the first, second, third, fourth, fifth and sixth clock.

In example embodiments, the present disclosure relates to a method for performing a charge-sharing operation in a charge pump circuit that includes a six-phase clock circuit and a gate boosting charge pump. The method comprises generating, by a first Boolean logic circuit of the six-phase clock circuit, a first clock signal (CLKNM1) and a second clock signal (CLKPM2), generating, by a second Boolean logic circuit of the six-phase clock circuit, a third clock signal (CLKNM2) and a fourth clock signal (CLKPM1), generating, by a tri-state buffer circuit of the six-phase clock circuit, a fifth clock signal (CLK) and a sixth clock signal (CLK_B), storing an amount of charge in each of the pump capacitors among a plurality of pump capacitors (cp1, cp2), enabling the charge-sharing operation to share the stored amount of charges between a plurality of parasitic capacitors, and providing, by the first and second Boolean logic circuits, a dead time between each of the first, second, third, fourth, fifth and sixth clock.

To further clarify the advantages and features of the present inventive concepts, a more particular description of the inventive concepts will be rendered by reference to specific example embodiments thereof, which are illustrated in the appended drawings. It is appreciated that these drawings depict only example embodiments of the inventive concepts and are therefore not to be considered limiting of its scope. The inventive concepts will be described and explained with additional specificity and detail with the accompanying drawings.

BRIEF DESCRIPTION OF THE DRAWINGS

These and other features, aspects, and advantages of the present inventive concepts will become better understood when the following detailed description is read with reference to the accompanying drawings in which like characters represent like elements throughout the drawings, wherein.

Figure 1:
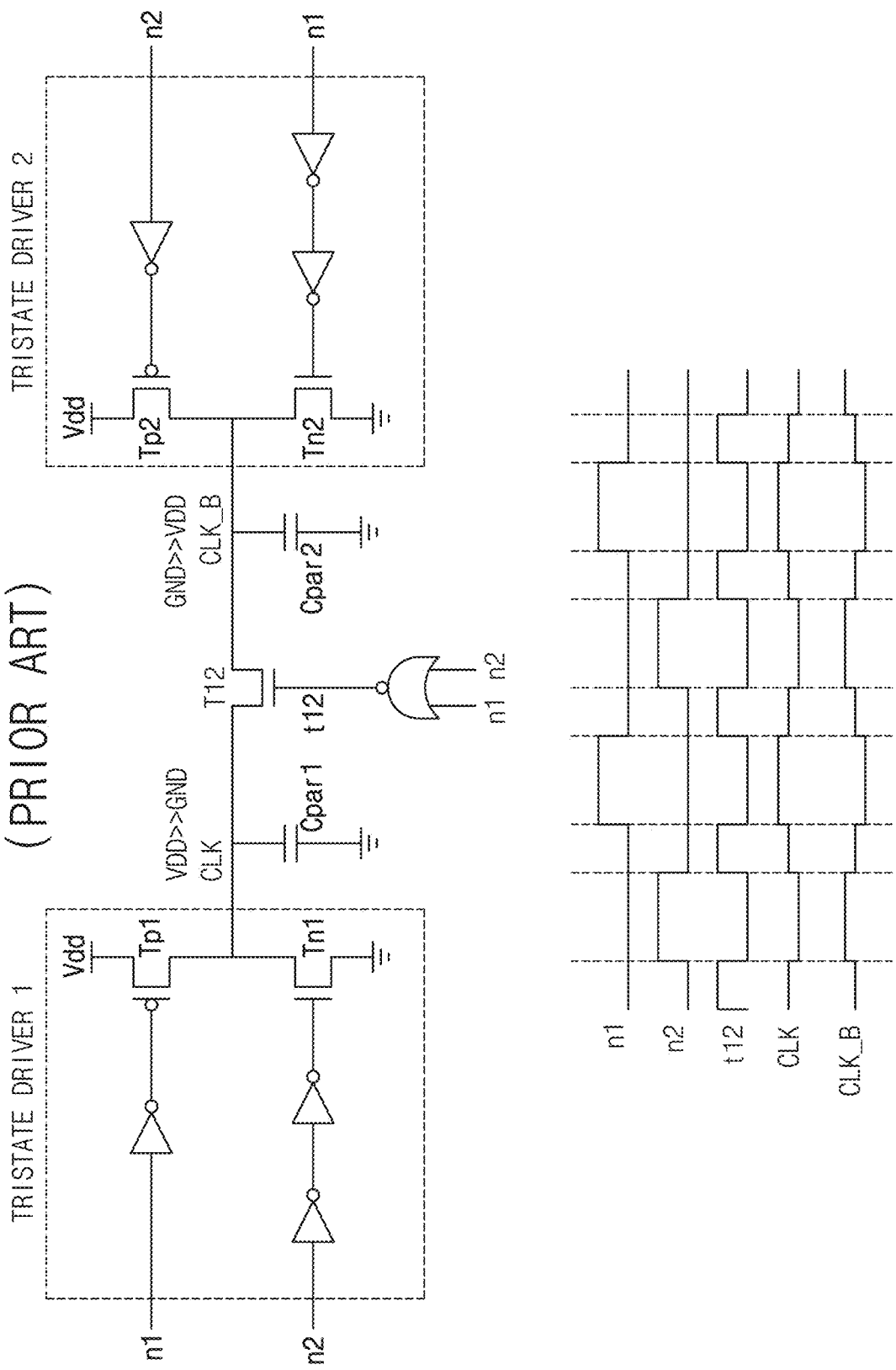
FIG. 1 illustrates a conventional charge pump circuit using a charge recycle mechanism, in accordance with a conventional state of the art.

Further, skilled artisans will appreciate that elements in the drawings are illustrated for simplicity and may not have necessarily been drawn to scale. Furthermore, in terms of the construction of the device, one or more components of the device may have been represented in the drawings by conventional symbols, and the drawings may show only those specific details that are pertinent to understanding the example embodiments of the present inventive concepts so as not to obscure the drawings with details that will be readily apparent to those of ordinary skill in the art having the benefit of the description herein.

DETAILED DESCRIPTION

It should be understood at the outset that although illustrative implementations of example embodiments of the present disclosure are illustrated below, the present inventive concepts may be implemented using any number of techniques, whether currently known or in existence. The present disclosure should in no way be limited to the illustrative implementations, drawings, and techniques illustrated below, including the example designs and implementations illustrated and described herein, but may be modified within the scope of the appended claims along with their full scope of equivalents.

The term "some" as used herein is defined as "one, or more than one, or all." Accordingly, the terms "one," "more than one," "more than one, but not all" or "all" would all fall under the definition of "some." The term "some example embodiments" may refer to one example embodiment or to several example embodiments or to all example embodiments. Accordingly, the term "some example embodiments" is defined as meaning "one example embodiment, or more than one example embodiment, or all example embodiments."

The terminology and structure employed herein are for describing, teaching, and illuminating example embodiments and their specific features and elements and do not limit, restrict, or reduce the scope of the claims or their equivalents.

Moreover, any terms used herein such as but not limited to "includes," "comprises," "has," "consists," and grammatical variants thereof do not specify an exact limitation or restriction and certainly do not exclude the possible addition of one or more features or elements, unless otherwise stated, and furthermore must not be taken to exclude the possible removal of one or more of the listed features and elements, unless otherwise stated with the limiting language "must comprise" or "needs to include."

Whether or not a certain feature or element was described in singular form, it may still be referred to as "one or more features" or "one or more elements" or "at least one feature" or "at least one element." Furthermore, the use of the terms "one or more" or "at least one" feature or element do not preclude there being none of that feature or element unless otherwise specified by limiting language such as "there needs to be one or more" or "one or more element is required."

Unless otherwise defined, all terms, and especially any technical and/or scientific terms, used herein may be taken to have the same meaning as commonly understood by one having ordinary skill in the art.

Example embodiments of the present inventive concepts will be described below in detail with reference to the accompanying drawings.

It should be noted that reference numeral CLKPM1 and CLKP1, CLKPM2 and CLKP2, CLKNM1 and CLKN1, and CLKNM2 and CLKN2 have been interchangeably used throughout the description and drawings, respectively.

Figure 2:
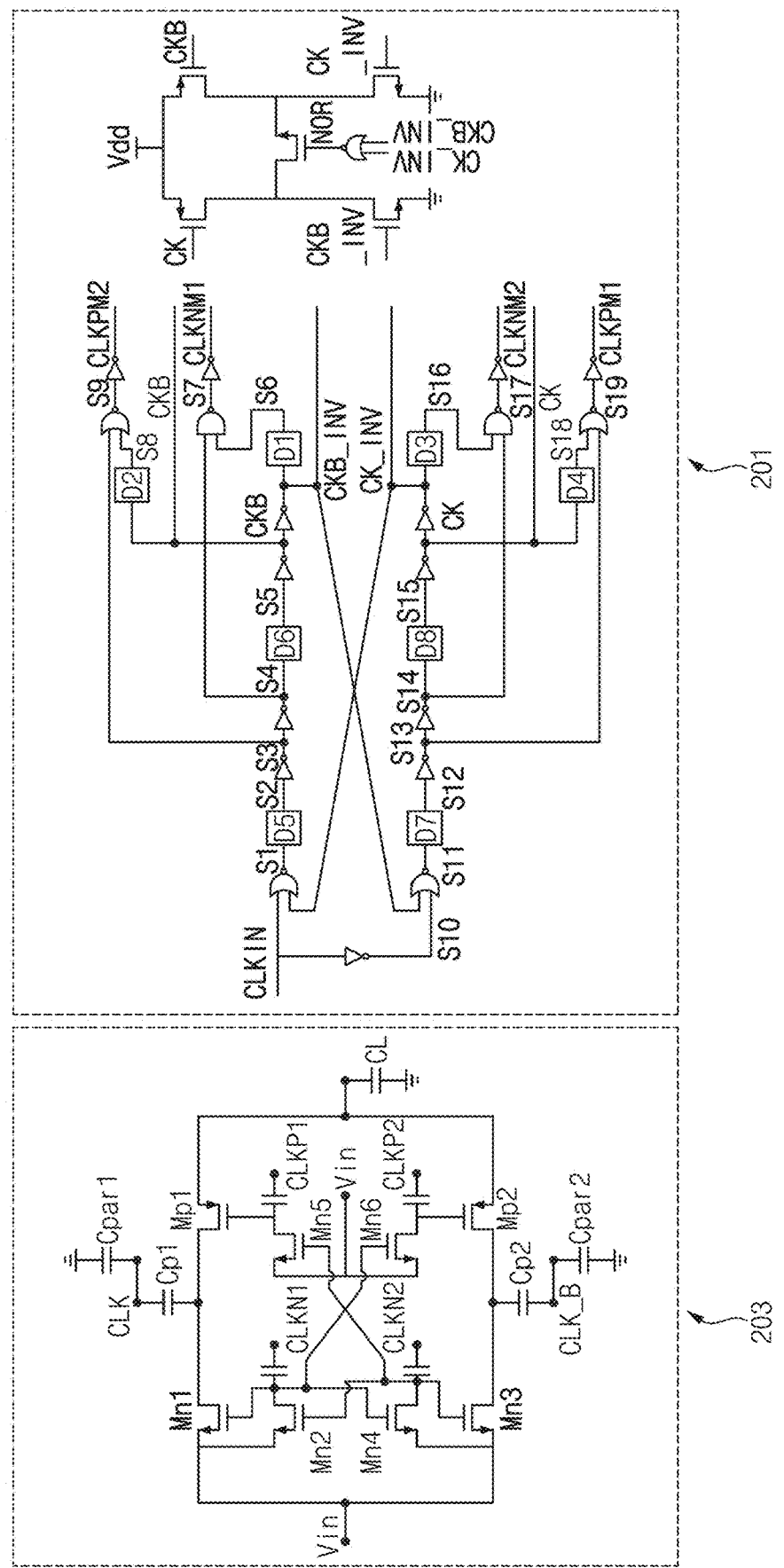
FIG. 2 illustrates a circuit architecture of a charge pump circuit with a six-phase clock, in accordance with example embodiments of the present disclosure.

FIG. 2 illustrates a circuit architecture of a charge pump circuit with a six-phase clock, in accordance with example embodiments of the present disclosure. As shown in FIG. 2, the charge pump circuit 200 comprises of a six-phase clock circuit 201 and a gate boosting charge pump 203. The gate boosting charge pump 203 is configured to receive a plurality of clock signals from the six-phase clock circuit 201. The six-phase clock circuit 201 comprises a first Boolean logic circuit including a first delay circuit D1 configured to output a first clock signal (CLKNM1) and a second delay circuit D2 configured to output a second clock signal (CLKPM2). The six-phase clock circuit 201 further comprises a second Boolean logic circuit including a third delay circuit D3 configured to output a third clock signal (CLKNM2) and a fourth delay circuit D4 configured to output a fourth clock signal (CLKPM1), and a tri-state buffer circuit configured to output a fifth clock signal (CLK) and a sixth clock signal (CLK_B). The gate boosting charge pump 203 includes a plurality of NMOS transistors configured to receive the first and third clock signals, wherein a first NMOS transistor (Mn1) of the plurality of NMOS is configured to receive the first clock signal (CLKNM1). The gate boosting charge pump 203 further includes a plurality of PMOS transistors configured to receive the second and fourth clock signals, wherein a first PMOS transistor (Mp1) of the plurality of PMOS transistors is configured to receive the fourth clock signal (CLKPM1). The gate boosting charge pump 203 also includes a plurality of pump capacitors (cp1, cp2), wherein each of the pump capacitors is configured to store an amount of charge. Further, the gate boosting charge pump 203 also includes a plurality of parasitic capacitors Cpar1 and Cpar2, which are bottom plate parasitic capacitors attached to pump capacitors cp1 and cp2, respectively. The detailed interconnection and working of each of the circuit components will be explained in the forthcoming paragraphs. Further, the reference numerals are kept the same wherever applicable for the sake of simplicity and ease of explanation.

Figure 3:
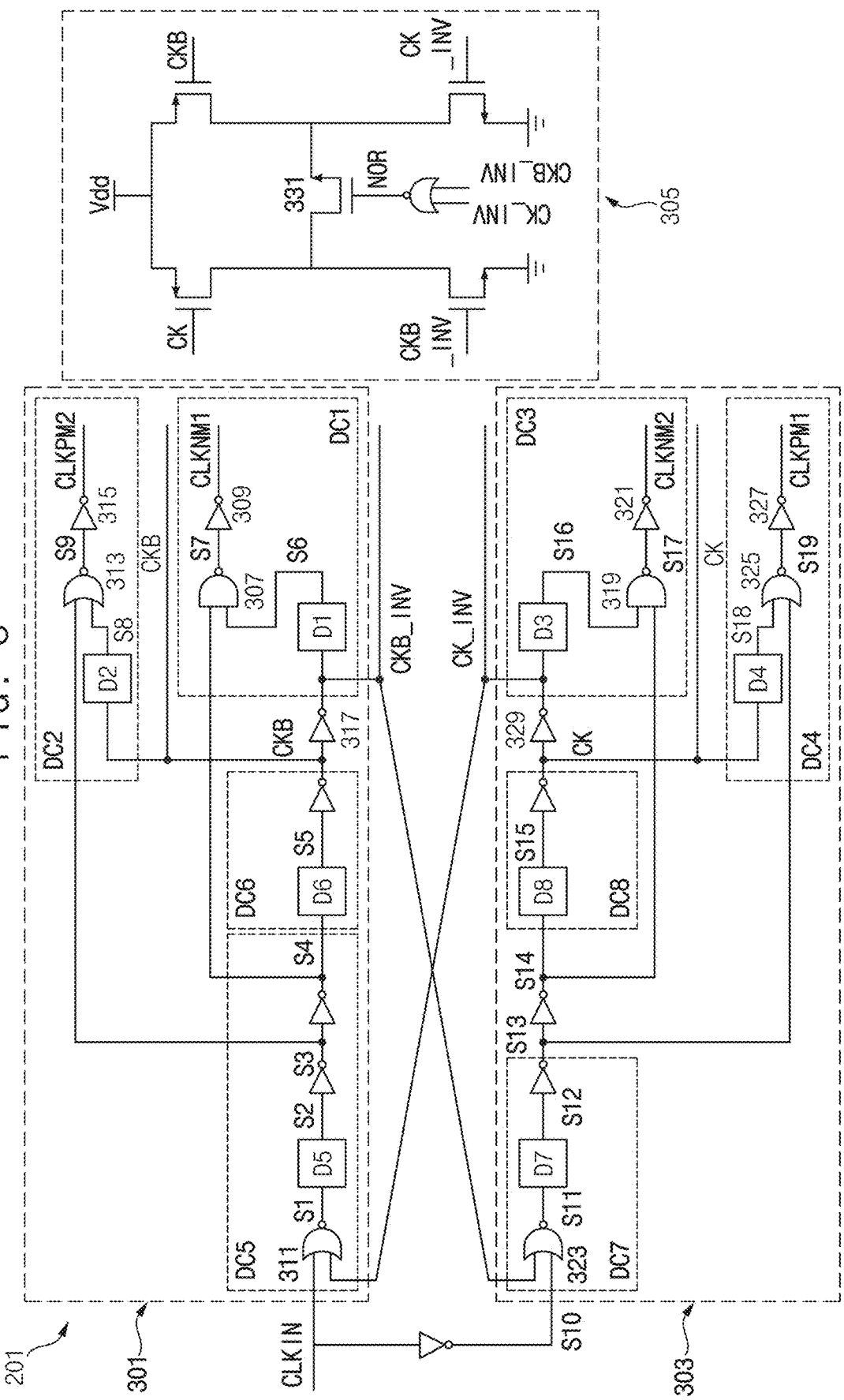
FIG. 3 illustrates a circuit architecture of the six-phase clock circuit, in accordance with example embodiments of the present disclosure.

Referring now to FIG. 3, FIG. 3 illustrates a circuit architecture of the six-phase clock circuit, in accordance with example embodiments of the present disclosure. As discussed in reference to FIG. 2, the six-phase clock circuit 201 comprises a first Boolean logic circuit 301 which provides the first clock signal (CLKNM1) and the second clock signal (CLKPM2). The first Boolean logic circuit 301 comprises a first delay circuit (DC1) which is configured to output the first clock signal (CLKNM1) and a second delay circuit (DC2) which is configured to output the second clock signal (CLKPM2). The first delay circuit (DC1) includes a first NAND gate 307, a first NOT gate 309, and a first delay component (D1). The first Boolean logic circuit 301 further includes a fifth delay circuit (DC5) and a sixth delay circuit (DC6). The fifth delay circuit (DC5) comprises a first delay NOR gate 311, a delay component (D5), and one or more NOT gate. An input terminal of the fifth delay circuit (DC5) is configured to receive an input clock signal (CLKIN) via the first delay NOR gate 311 and an output terminal (S4) of the fifth delay circuit (DC5) is connected to an input terminal of the first NAND gate 307. The sixth delay circuit (DC6) comprises a delay component (D6) and one or more NOT gate, wherein the output of the one or more NOT gate is CKB.

The second delay circuit (DC2) includes a first NOR gate 313, a second NOT gate 315, and a second delay component (D2). As shown in FIG. 3, an output terminal (CKB) of the sixth delay circuit (DC6) is connected to an input terminal of the first NOR gate 313. As can be seen from FIG. 3, the output terminal (CKB) of the sixth delay circuit (DC6) is also connected to the input terminal of the first NAND gate 307 via the first delay component (D1) after being inverted by a NOT gate 317. Further, the second delay element (D2) is placed between the output terminal (CKB) of the sixth delay circuit (DC6) and the input terminal of the first NOR gate 313.

The six-phase clock circuit 201 further comprises a second Boolean logic circuit 303 which provides the third clock signal (CLKNM2) and the fourth clock signal (CLKPM1). The second Boolean logic circuit 303 comprises the third delay circuit (DC3) which is configured to output the third clock signal (CLKNM2) and the fourth delay circuit (DC4) which is configured to output the fourth clock signal (CLKPM1). The third delay circuit (DC3) includes a second NAND gate 319, a third NOT gate 321, and a third delay component (D3). The second Boolean logic circuit 303 further includes a seventh delay circuit (DC7) and an eighth delay circuit (DC8). The seventh delay circuit (DC7) comprises a second delay NOR gate 323, a delay component (D7), and one or more NOT gate. An input terminal of the seventh delay circuit (DC7) is configured to receive an inverse input clock signal (CLK_IN) via the second delay NOR gate 323 and an output terminal (S13) of the seventh delay circuit (DC7) is connected to an input terminal of the second NAND gate 319 via a NOT gate. The eighth delay circuit (DC8) comprises a delay component (D8) and one or more NOT gate, wherein the output of the one or more NOT gate is CK.

The fourth delay circuit (DC4) includes a second NOR gate 325, a fourth NOT gate 327, and a fourth delay component (D4). As shown in FIG. 3, an output terminal (CK) of the eighth delay circuit (DC8) is connected to an input terminal of the second NOR gate 325. As can be seen from FIG. 3, the output terminal (CK) of the eighth delay circuit (DC8) is also connected to the input terminal of the second NAND gate 319 via the third delay component (D3) after being inverted by a NOT gate 329. Further, the fourth delay element (D4) is placed between the output terminal (CK) of the eighth delay circuit (DC8) and the input terminal of the second NOR gate 325.

The six-phase clock circuit 201 further comprises a tristate buffer circuit 305 configured to output the fifth clock signal (CLK) and the sixth clock signal (CLK_B). The tristate buffer circuit 305 includes a plurality of buffer NMOS transistors, a plurality of buffer PMOS transistors, a pass transistor connecting the fifth and sixth clock signal, and a buffer NOR gate, wherein each of the buffer NMOS transistor, the buffer PMOS transistor and the buffer NOR gate are connected to form a tristate, as shown in FIG. 3. In particular, when both CK and CKB goes High, the tristate buffer circuit 305 enters into tristate. This condition also turns on the pass transistor 331 connecting CLK and CLK_B.

In other words, there is a delay in the generation of each of the first, second, third, fourth, fifth, and sixth clock. The working of FIG. 3 is as follows:

S11 goes High. CK goes low after delay, making CLK High.
S16 goes High after delay, making CLKNM2=High.
Simultaneously S18 goes low making CLKPM1=Low.
S13 goes High, making CLKPM1=High.
Simultaneously S14 goes Low turning CLKMN2=Low.
S11 goes Low. CK becomes High after a delay.
CK and CKB both are high, they drive the buffer in tristate.
S1 goes High. CKB goes low after delay, making CLK_B High.
S6 goes High after delay, making CLKNM1=High.
Simultaneously S8 goes low making CLKPM2=Low.
S3 goes High, making CLKPM2=High.
Simultaneously S4 goes Low turning CLKMN2=Low.
S1 goes Low. CKB becomes High after a delay.
CK and CKB both are high, they drive the buffer in tristate Hence, with the help of a plurality of delay circuits and delay elements, the first and second Boolean logic circuit are configured to provide a dead time between each of the first, second, third, fourth, fifth and sixth clock.

Figure 4:
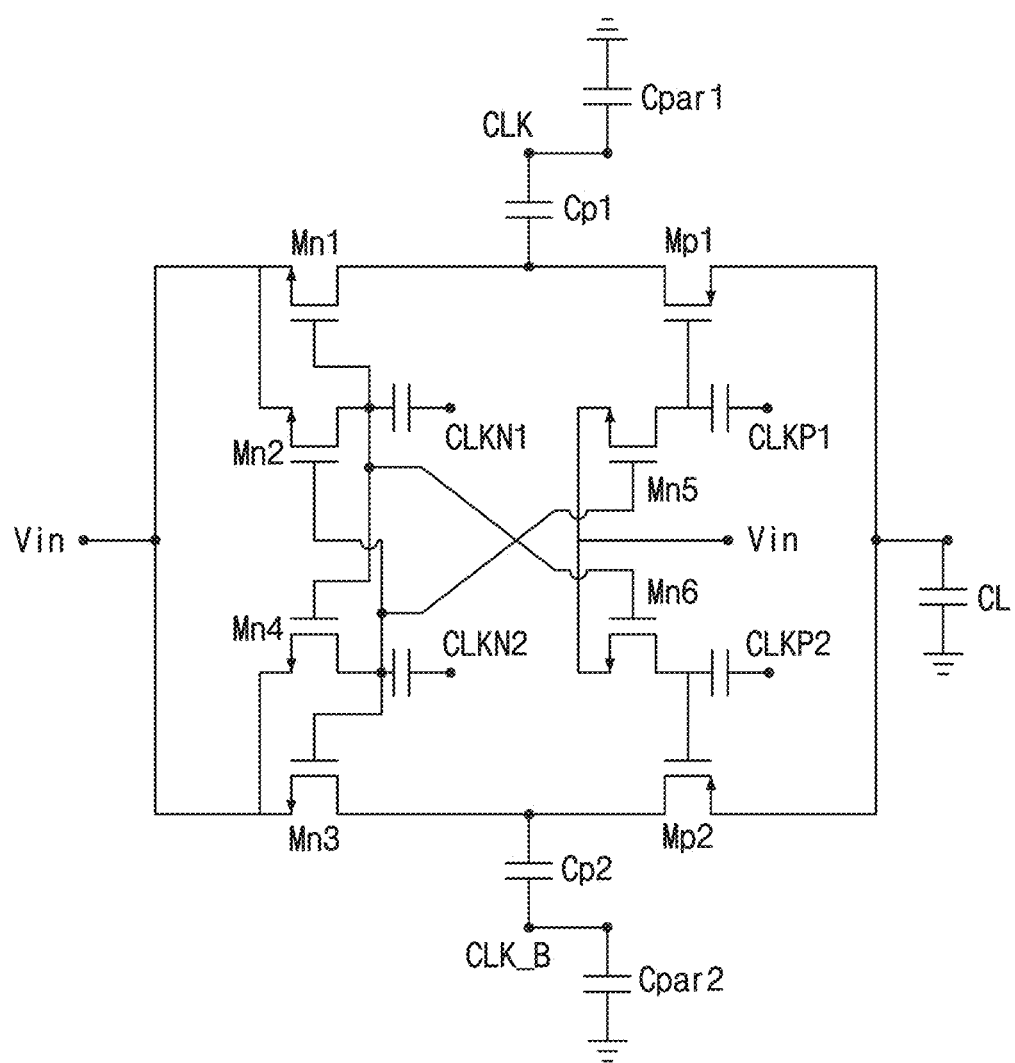
FIG. 4 illustrates a circuit architecture of the gate boosting charge pump, in accordance with example embodiments of the present disclosure.

FIG. 4 illustrates a circuit architecture of the gate boosting charge pump 203, in accordance with example embodiments of the present disclosure. As discussed in reference to FIG. 2, the gate boosting charge pump 203 comprises a plurality of NMOS transistors (Mn1, Mn2, Mn3, Mn4, Mn5, Mn6) configured to receive the first and third clock signals, wherein a first NMOS transistor (Mn1) of the plurality of NMOS transistors is configured to receive the first clock signal (CLKNM1). In example embodiments, the plurality of NMOS transistors are gate boosting NMOS transistors. The gate boosting charge pump 203 further comprises a plurality of PMOS transistors (Mp1, Mp2) configured to receive the second and fourth clock signals, wherein a first PMOS transistor (Mp1) of the plurality of PMOS transistor is configured to receive the fourth clock signal (CLKPM1. The gate boosting charge pump 203 further comprises a plurality of pump capacitors (cp1, cp2), wherein each of the pump capacitors is configured to store an amount of charge. When the third clock signal (CLKNM2) is in a positive phase, the second NMOS transistor (Mn3) is turned ON to store the amount of charge in a second pump capacitor (cp2). Further, when the first clock signal (CLKNM1) is in a positive phase, a first NMOS transistor (Mn1) from the plurality of NMOS transistors is turned ON to store the amount of charge in a first pump capacitor (cp1). The gate boosting charge pump 203 is further configured to enable a charge-sharing operation to share the stored amount of charges between the plurality of parasitic capacitors (Cpar1, Cpar2). The working of the gate boosting charge pump 203 and the tristate buffer is explained here below in four parts:

Part 1: CLK-High, Mp1 turns ON and provides the output current. Mn3 turns on allowing the charging of the second pump capacitor Cp2. CLKMP1-Low and CLKMN2-High. Input is shorted to the top plate of the second pump capacitor Cp2 and is charging the capacitor Cp2 to VDD. Output is shorted to the top plate of the first pump capacitor Cp1 and is getting charged to 2VDD. Here, Mp1 and Mn3 turn ON only when CLK and CLK_B have made their respective transitions. In reference to FIG. 3, CK is delayed and inverted signal of S11. When CK goes low, CLK goes high. S16 is delayed and inverted signal of CK. It triggers the turning ON of the second NMOS transistor Mn3. The delay ensures that NMOS turns ON only when CLK had made the transition. S18 is a delayed signal of CK. It triggers the turning ON of the first PMOS transistor Mp1. The delay ensures that PMOS turns ON only when CLK had made the transition. Hence, any reversion during the transition of clock signals is avoided.

Part 2: CLK and CLK_B-shorted, NOR gates turn on PMOS switch and charge-sharing operation is enabled. All switches are off during this phase. Referring back to FIG. 3, S13 is an advanced signal of CK. It triggers the turning off the first PMOS transistor Mp1. The advanced signal ensures that the first PMOS transistor Mp1 turns OFF before CLK had made the transition. S14 is an advanced and inverted signal of CK. It triggers the turning off the second NMOS transistor mN3. The advance signal ensures that the second NMOS transistor mN3 turns OFF only before CLK and CLK_B make a transition. CK is delayed and inverted signal of S11. When CK goes HIGH, PMOS of tristate buffer turns OFF, since CKB is high as well, both CLK and CLK_B are short together. Hence, any reversion during the transition of clock signals is avoided. In the region both CK and CKB are High (Due to dead time generation), the CLK and CLK_B buffer enters in tristate, shorting both the clock and it allows the charge-sharing operation to occur between the bottom plate parasitic capacitor of Cpar1 and Cpar2.

Part 3: CLK_B-High, Mp2 turns ON and provides the output current. Mn1 turns on allowing the charging of the first pump capacitor Cp1. CLKMP2-Low and CLKMN1-High. Referring back to FIG. 3, CKB is delayed and inverted signal of S1. When CKB goes low, CLK_B goes high. S6 is delayed and inverted signal of CKB. It triggers the turning ON of the first NMOS transistor mN1. The delay ensures that the first NMOS transistor mN1 turns ON only when CLK_B had made the transition. S8 is a delayed signal of CKB. It triggers the turning ON of the second PMOS transistor mP2. The delay ensures that the second PMOS transistor mP2 turns ON only when CLK_B had made the transition. Hence, any reversion during the transition of clock signals is avoided.

Part 4: CLK and CLK_B—shorted, NOR gates turns on PMOS switch and charge-sharing operation is enabled. All switches are off during this phase. Referring back to FIG. 3, S3 is an advanced signal of CKB. It triggers the turning off the PMOS. The advanced signal ensures that the second PMOS transistor mP2 turns OFF before CLK_B had made the transition. S4 is an advanced and inverted signal of CKB. It triggers the turning off the first NMOS transistor mN1. The advance signal ensures that the first NMOS transistor mN1 turns OFF only before CLK_B makes the transition. CKB is delayed and inverted signal of S1. When CKB goes HIGH, PMOS of tristate buffer turns OFF, since CK is high as well, both CLK and CLK_B are short together. Hence, any reversion during the transition of clock signals is avoided. In the region both CK and CKB are High (Due to dead time generation), the CLK and CLK_B buffer enters in tristate, shorting both the clock and it allows the charge-sharing operation to occur between the bottom plate parasitic capacitor of Cpar1 and Cpar2.

Hence, each of the plurality of PMOS transistors and the plurality of NMOS transistors are turned ON after completion of the charge-sharing operation. Further, there is no charge loss in the parasitic capacitors Cpar1 and Cpar 2.

Figure 5:
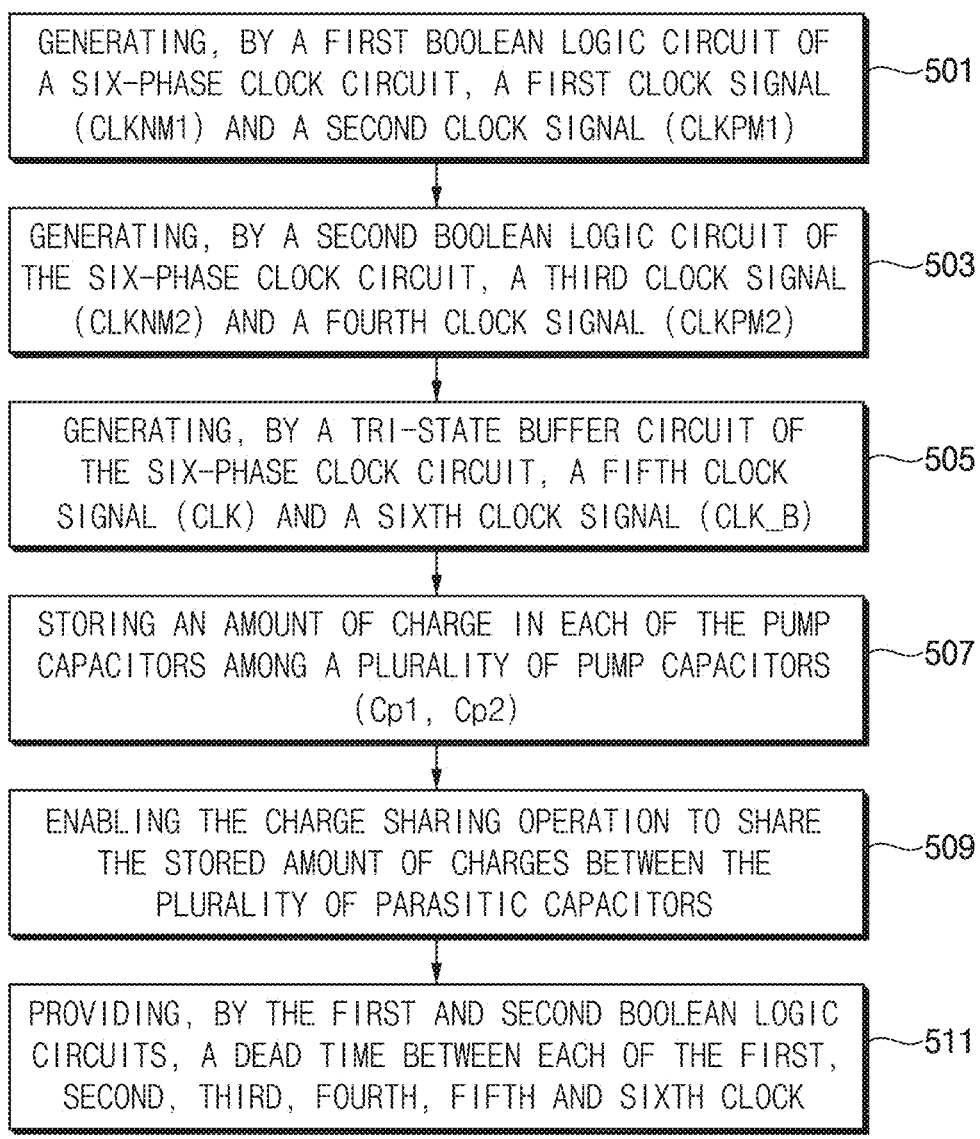
FIG. 5 illustrates a flow diagram depicting a method for performing a charge-sharing operation in a charge pump circuit that includes a six-phase clock circuit and a gate boosting charge pump, in accordance with example embodiments of the present disclosure.

FIG. 5 illustrates a flow diagram depicting a method for performing a charge-sharing operation in a charge pump circuit that includes a six-phase clock circuit and a gate boosting charge pump, in accordance with example embodiments of the present disclosure. As shown in FIG. 5, at operation 501, the method 500 comprises generating, by a first Boolean logic circuit of the six-phase clock circuit, a first clock signal (CLKNM1) and a second clock signal (CLKPM2). At operation 503, the method 500 comprises generating, by a second Boolean logic circuit of the six-phase clock circuit, a third clock signal (CLKNM2), and a fourth clock signal (CLKPM1). At operation 505, the method 500 comprises generating, by a tri-state buffer circuit of the six-phase clock circuit, a fifth clock signal (CLK) and a sixth clock signal (CLK_B). At operation 507, the method 500 comprises storing an amount of charge in each of the pump capacitors among a plurality of pump capacitors (cp1, cp2). At operation 509, the method 500 comprises enabling the charge-sharing operation to share the stored amount of charges between the plurality of parasitic capacitors (Cpar1, Cpar2). At operation 511, the method 500 comprises providing, by the first and second Boolean logic circuits, a dead time between each of the first, second, third, fourth, fifth and sixth clock. It should be noted that the method 500 may be performed by the charge pump circuit of FIG. 2.

Further, in any of the above-mentioned example embodiments, the charge pump circuit 200 of the present disclosure may have any number of delay circuits, delay components, NOR gates, NAND gates, PMOS transistors, and NMOS transistors different from the number of said elements shown in FIGS. 2-4.

While specific language has been used to describe the disclosure, any limitations arising on account of the same are not intended. As would be apparent to a person in the art, various working modifications may be made to implement the inventive concepts as taught herein.

The drawings and the forgoing description give examples of example embodiments. Those skilled in the art will appreciate that one or more of the described elements may be combined into a single functional element. Alternatively, certain elements may be split into multiple functional elements. Elements from one example embodiment may be added to another example embodiment.

Also, those acts that are not dependent on other acts may be performed in parallel with the other acts. The scope of example embodiments is by no means limited by these specific examples. Numerous variations, whether explicitly given in the specification or not, such as differences in structure, dimension, and use of material, are possible. The scope of example embodiments is at least as broad as given by the following claims.

Benefits, other advantages, and solutions to problems have been described above with regard to specific example embodiments. However, the benefits, advantages, solutions to problems, and any component(s) that may cause any benefit, advantage, or solution to occur or become more pronounced are not to be construed as a critical, required, or essential feature or component of any or all the claims.

We claim:

1. A charge pump circuit with a six-phase clock, comprising:
   a six-phase clock circuit; and
   a gate boosting charge pump configured to receive a plurality of clock signals from the six-phase clock circuit, wherein
   the six-phase clock circuit includes:
      a first Boolean logic circuit including a first delay circuit configured to output a first clock signal and a second delay circuit configured to output a second clock signal,
      a second Boolean logic circuit including a third delay circuit configured to output a third clock signal and a fourth delay circuit configured to output a fourth clock signal, and
      a tri-state buffer circuit configured to output a fifth clock signal and a sixth clock signal; and
   the gate boosting charge pump includes:
      a plurality of NMOS transistors configured to receive the first and third clock signals, wherein a first NMOS transistor of the plurality of NMOS transistors is configured to receive the first clock signal,
      a plurality of PMOS transistors configured to receive the second and fourth clock signals, wherein a first PMOS transistor of the plurality of PMOS transistors is configured to receive the fourth clock signal, and
      a plurality of pump capacitors, wherein each of the pump capacitors is configured to store an amount of charge,
         wherein the gate boosting charge pump is further configured to enable a charge-sharing operation to share the stored amount of charges between a plurality of parasitic capacitors,
         wherein the first and second Boolean logic circuit are configured to provide a dead time between each of the first, second, third, fourth, fifth and sixth clock signals,
         wherein the first Boolean logic circuit is configured to output a seventh clock signal and provide the seventh clock signal to the tri-state buffer circuit,
         wherein the second Boolean logic circuit is configured to output an eighth clock signal and provide the eighth clock signal to the tri-state buffer circuit, and
         the tri-state buffer circuit is configured to output the fifth and the sixth clock signals based on the seventh and eighth clock signals.

2. The charge pump circuit as claimed in claim 1, wherein the first delay circuit includes a first NAND gate, a first NOT gate, and a first delay component, and
   wherein the first Boolean logic circuit further includes a fifth delay circuit and a sixth delay circuit, wherein an input terminal of the fifth delay circuit is configured to receive an input clock signal and an output terminal of the fifth delay circuit is connected to an input terminal of the first NAND gate.

3. The charge pump circuit as claimed in claim 2, wherein the second delay circuit includes a first NOR gate, a second NOT gate, a second delay component,
   wherein an output terminal of the sixth delay circuit is connected to an input terminal of the first NOR gate.

4. The charge pump circuit as claimed in claim 1, wherein the third delay circuit includes a second NAND gate, a third NOT gate, and a third delay component, and
   wherein the second Boolean logic circuit further includes a seventh delay circuit and an eighth delay circuit, wherein an input terminal of the seventh delay circuit is configured to receive an inverse input clock signal and an output terminal of the seventh delay circuit is connected to an input terminal of the second NAND gate.

5. The charge pump circuit as claimed in claim 4, wherein the fourth delay circuit includes a second NOR gate, a fourth NOT gate, a fourth delay component, and
   wherein an output terminal of the eighth delay circuit is connected to an input terminal of the second NOR gate.

6. The charge pump circuit as claimed in claim 1, wherein the tri-state buffer circuit includes a plurality of buffer NMOS transistors, a plurality of buffer PMOS transistors, a pass transistor connecting the fifth and sixth clock signal and a buffer NOR gate, wherein each of the plurality of buffer NMOS transistor, the plurality of buffer PMOS transistors and the buffer NOR gate are connected to form a tristate.

7. The charge pump circuit as claimed in claim 1, wherein the gate boosting charge pump is further configured to enable the charge-sharing operation in case each of the fifth clock signal and the sixth clock signal is in a negative phase.

8. The charge pump circuit as claimed in claim 1, wherein each of the plurality of pump capacitors is configured to store an amount of charge:
   when the third clock signal is in positive phase to turn ON a second NMOS transistor so as to store the amount of charge in a second pump capacitor, and
   when the first clock signal is in positive phase to turn ON the first NMOS transistor from the plurality of NMOS transistors so as to store the amount of charge in a first pump capacitor.

9. The charge pump circuit as claimed in claim 1, wherein the plurality of PMOS transistors and the plurality of NMOS transistors are configured to turn ON after completion of the charge-sharing operation.

10. A method for performing a charge-sharing operation, comprising:
    in a charge pump circuit that includes a six-phase clock circuit and a gate boosting charge pump:
       generating, by a first Boolean logic circuit of the six-phase clock circuit, a first clock signal and a second clock signal;
       generating, by a second Boolean logic circuit of the six-phase clock circuit, a third clock signal, and a fourth clock signal;
       generating, by a tri-state buffer circuit of the six-phase clock circuit, a fifth clock signal and a sixth clock signal, wherein the fifth and sixth clock signals are based on a seventh clock signal obtained from the first Boolean logic circuit and an eighth clock signal obtained from the second Boolean logic circuit;
       storing an amount of charge in each pump capacitor among a plurality of pump capacitors;
       enabling the charge-sharing operation to share the stored amount of charges between a plurality of parasitic capacitors; and
       providing, by the first and second Boolean logic circuits, a dead time between each of the first, second, third, fourth, fifth and sixth clock signals.

11. The method as claimed in claim 10, further comprising:
    enabling the charge-sharing operation in case each of the fifth clock signal and the sixth clock signal is in a negative phase.

12. The method as claimed in claim 10, further comprising:
- receiving, by a plurality of NMOS transistors, the second and fourth clock signals; and
- receiving, by a plurality of PMOS transistors, the first and third clock signals.

13. The method as claimed in claim 12, wherein the amount of charge is stored in each pump capacitor of the plurality of pump capacitors:
- when the third clock signal is in a positive phase to turn ON a second NMOS transistor of the plurality of NMOS transistors so as to store the amount of charge in a second pump capacitor, and
- when the first clock signal is in a positive phase to turn ON a first NMOS transistor of the plurality of NMOS transistors so as to store the amount of charge in a first pump capacitor.

14. The method as claimed in claim 12, further comprising:
- turning ON each of the plurality of PMOS transistors and the plurality of NMOS transistors after completion of the charge-sharing operation.

\* \* \* \* \*